United States Patent
Muthali et al.

(10) Patent No.: US 8,334,715 B1
(45) Date of Patent: Dec. 18, 2012

(54) METHOD TO ACHIEVE CONSTANT SLEW RATE (OVER PROCESS CORNERS) FOR AN OUTPUT BUFFER

(75) Inventors: Harish S. Muthali, San Jose, CA (US); Xiaojun Zhu, Saratoga, CA (US)

(73) Assignee: Ambarella, Inc., Santa Clara, CA (US)

( * ) Notice: Subject to any disclaimer, the term of this patent is extended or adjusted under 35 U.S.C. 154(b) by 83 days.

(21) Appl. No.: 13/157,488

(22) Filed: Jun. 10, 2011

(51) Int. Cl.
*H03K 5/12* (2006.01)

(52) U.S. Cl. ........ 327/170; 327/172; 327/175; 327/276; 326/46

(58) Field of Classification Search ................... 327/170, 327/172, 175, 276; 326/46
See application file for complete search history.

(56) References Cited

U.S. PATENT DOCUMENTS 7,109,768 B2 * 9/2006 Rashid ............................ 327/170
7,560,952 B2 * 7/2009 Zhu et al. ......................... 326/38

* cited by examiner

*Primary Examiner* — John Poos
(74) *Attorney, Agent, or Firm* — Christopher P. Maiorana, PC

(57) ABSTRACT

An apparatus comprising a first circuit, a state machine, a compare circuit and a calibration circuit. The first circuit may be configured to generate a slew rate control signal and a calibration signal in response to (i) a plurality of control bits and (ii) an operation signal. The state machine may be configured to generate the operation signal and a plurality of intermediate control signals in response to (i) a compare signal and (ii) clock signal. The compare circuit may be configured to generate the compare signal in response to (i) a reference voltage and (ii) a capacitance signal. The calibration circuit may be configured to generate the capacitance signal in response to (i) the calibration signal and (ii) the plurality of intermediate control signals.

14 Claims, 6 Drawing Sheets

METHOD TO ACHIEVE CONSTANT SLEW RATE (OVER PROCESS CORNERS) FOR AN OUTPUT BUFFER

FIELD OF THE INVENTION

The present invention relates to output buffers generally and, more particularly, to a method and/or apparatus to implement a constant slew rate (over process corners) for an output buffer.

BACKGROUND OF THE INVENTION

Conventional output buffers sometimes solve slew rate variation issues by implementing "tuning" capacitors with switchable capacitor banks. The tuning capacitors allow post production tuning. Tuning resistors result in an area and labor penalty, as well as additional calibration circuitry, which add to the overall cost.

Conventional tunable capacitors can be implemented with a bank of switchable capacitors. Depending on the process corners, a certain number of capacitors are switched in or out. Calibration circuitry determines the capacitor variation from the nominal value. In conventional approaches, the switchable capacitor banks need to be implemented as part of the output buffer.

It would be desirable to implement a method to achieve constant slew rate (over process corners) for an output buffer.

SUMMARY OF THE INVENTION

The present invention concerns an apparatus comprising a first circuit, a state machine, a compare circuit and a calibration circuit. The first circuit may be configured to generate a slew rate control signal and a calibration signal in response to (i) a plurality of control bits and (ii) an operation signal. The state machine may be configured to generate the operation signal and a plurality of intermediate control signals in response to (i) a compare signal and (ii) a clock signal. The compare circuit may be configured to generate the compare signal in response to (i) a reference voltage and (ii) a capacitance signal. The calibration circuit may be configured to generate the capacitance signal in response to (i) the calibration signal and (ii) the plurality of intermediate control signals.

The objects, features and advantages of the present invention include providing a method to achieve constant slew rate (over process corners) for an output buffer that may (i) resolve slew rate variation issues, (ii) compensate for capacitor variation, (iii) implement an automatic calibration loop, (iv) be implemented in applications where a current is integrated across a capacitor, (v) be implemented without post-production tuning and/or tuning capacitors, and/or (vi) be cost effective to implement.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 1:
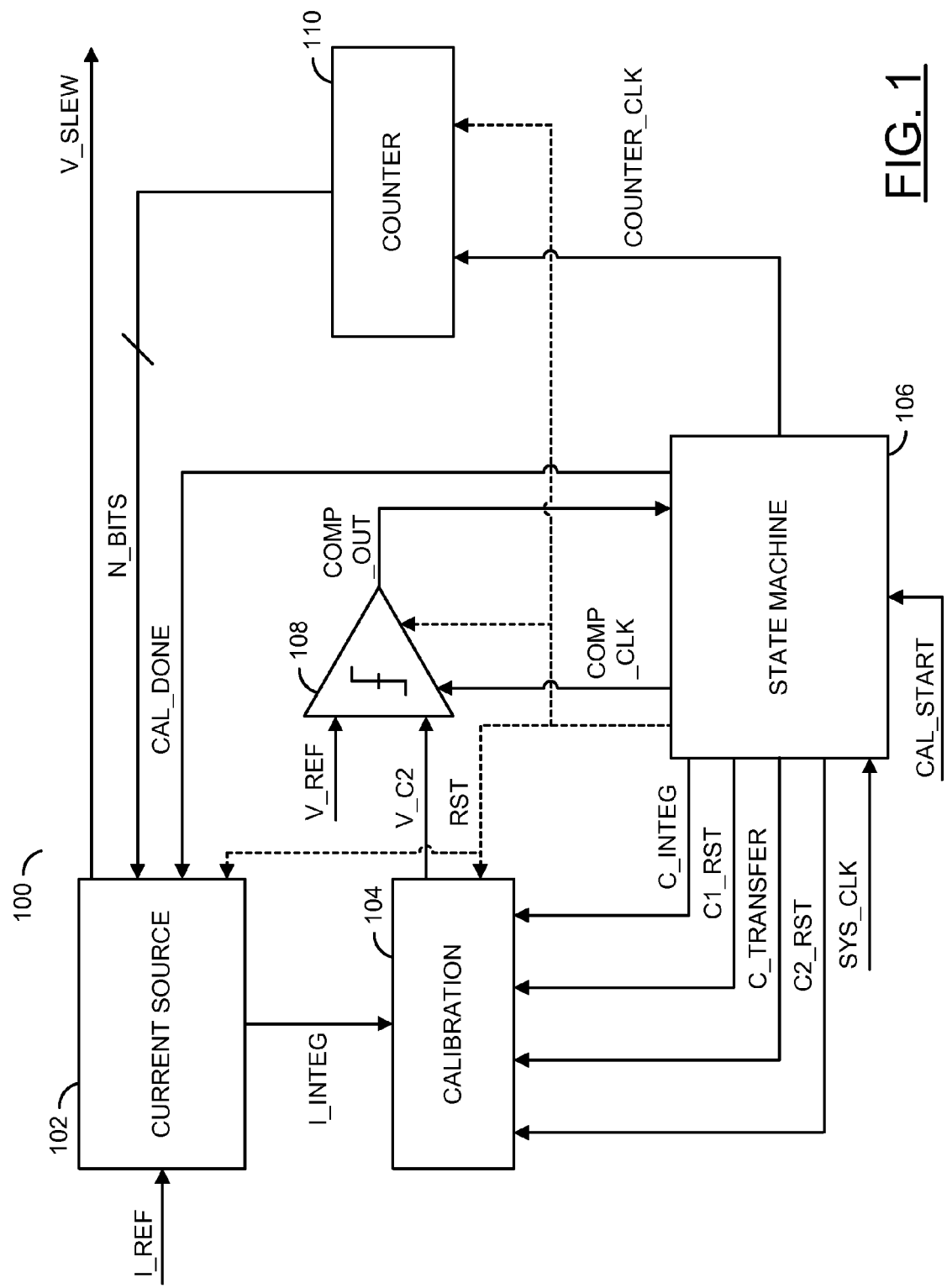
FIG. 1 is a block diagram of the present invention.

Referring to FIG. 1, a block diagram of a system 100 is shown in accordance with a preferred embodiment of the present invention. The circuit 100 generally comprises a block (or circuit) 102, a block (or circuit) 104, a block (or circuit) 106, a block (or circuit) 108 and a block (or circuit) 110. The circuit 102 may be implemented as a current source circuit. The circuit 104 may be implemented as a calibration circuit. The circuit 106 may be implemented as a state machine. The circuit 108 may be implemented as a comparator. The circuit 110 may be implemented as a counter circuit. In one example, the circuit 110 may be implemented as an up counter. In another example, the circuit 110 may be implemented as a down counter.

The circuit 102 may receive a signal (e.g., I_REF), a signal (e.g., N_BITS) and a signal (e.g., CAL_DONE). The circuit 102 may generate a signal (e.g., I_INTEG) and a signal (e.g., V_SLEW). The circuit 104 may receive the signal I_INTEG, a signal (e.g., C_INTEG), a signal (e.g., C1_RST), a signal (e.g., C_TRANSFER) and a signal (e.g., C2_RST). The circuit 104 may generate a signal (V_C2). The circuit 106 may receive a signal (e.g., SYS_CLK), a signal (e.g., CAL_START) and a signal (e.g., COMP_OUT). The circuit 106 may generate the signal C_INTEG, the signal C1_RST, the signal C_TRANSFER, the signal C2_RST, the signal CAL_DONE, a signal (e.g., COMP_CLK) and a signal (COUNTER_CLK). The circuit 108 may receive the signal V_C2, a signal (e.g., V_REF) and the signal COMP_CLK. The circuit 108 may generate the signal COMP_OUT. The circuit 110 may generate the signal N_BITS in response to the signal COUNTER_CLK. The circuit 106 may also generate a signal (e.g., RST). The circuits 102, 104, 108 and/or 110 may receive the signal RST. The signal RST may be a reset (or preset) signal. The signal LST may initialize the system 100. The blocks 100, 104, 110, 106, and/or 108 may form a closed loop calibration setup where in calibration is initiated with a signal CAL_START transitioning HIGH. For calibration to occur, a precision current reference I_REF may be supplied and the clock signal SYS_CLK is running.

Figure 2:
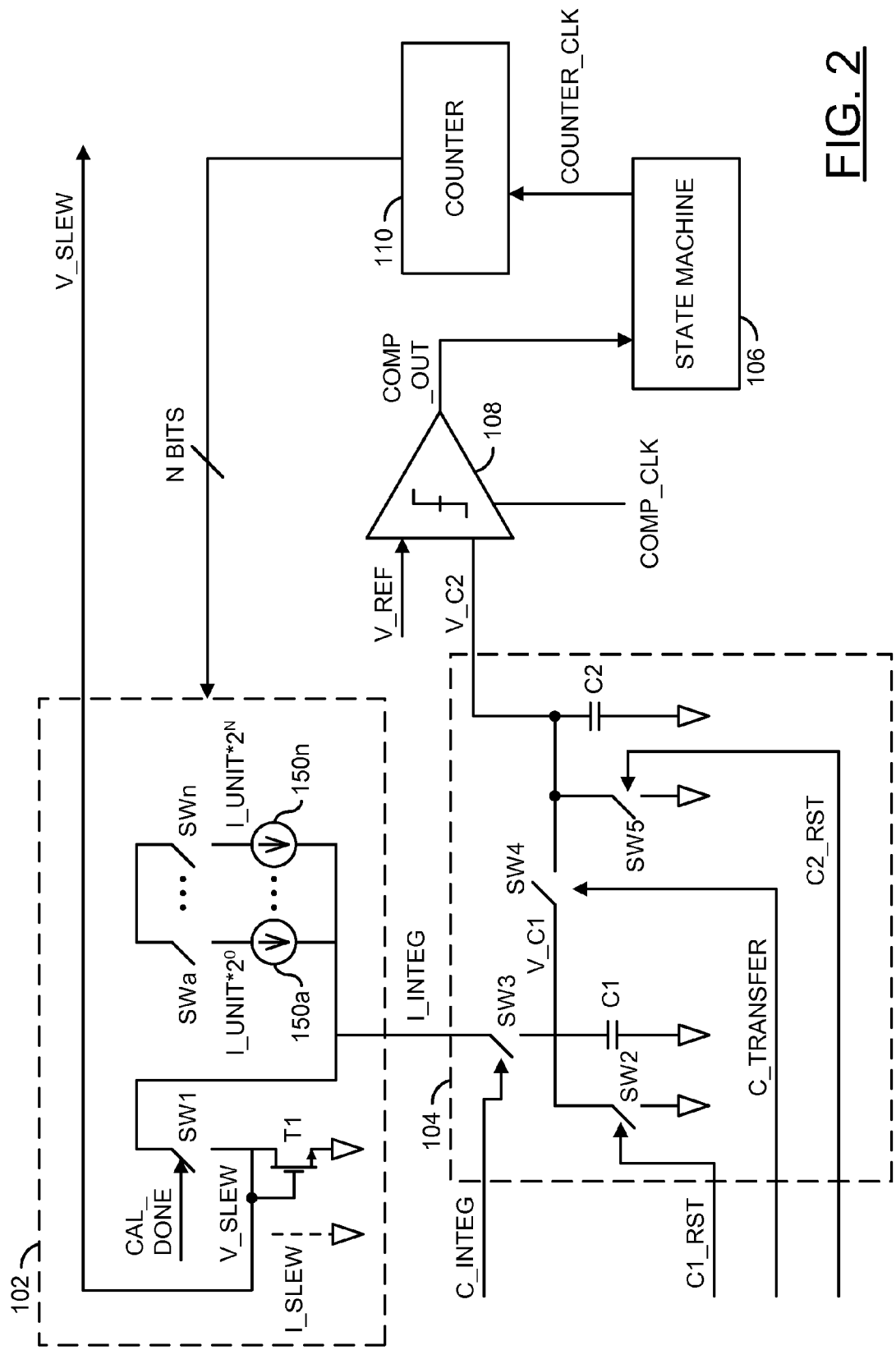
FIG. 2 is a more detailed block diagram of the present invention.

Referring to FIG. 2, a more detailed diagram of the system 100 is shown. The circuit 102 may comprise a plurality of current sources 150a-150n. Each of the current sources 150a-150n may have a corresponding switch SWa-SWn, a transistor T1, and a switch SW1. In one example, the transistor T1 may be implemented as an NMOS device. However, the particular type of transistor implemented may be varied to meet the design criteria of a particular implementation. The circuit 104 may comprise a switch SW2, a switch SW3, a switch SW4, a switch SW5, a capacitor C1, and a capacitor C2. In one example, the current sources 150a-150n may be implemented as a plurality of N-bit binary weighted current sources. In one example, the circuit 106 may be implemented using digital circuitry. In one example, the circuit 110 may also be implemented using digital circuitry.

The circuit 104 may comprise a capacitor calibration loop. The circuit 104 may provide calibration through the capacitors C1 and C2 and/or the switches SW2-SW5. The capacitors C1 and C2 and the switches SW2-SW5 may be controlled by the state machine 106 during calibration. The capacitors C1 and C2 may be charged by the calibration current I_IN- TEG. The voltage developed across the capacitors C1 and C2 (e.g., V_C2) may be compared with a known reference voltage (e.g., V_REF).

In one example, the comparator 108 may be a low input offset comparator. The comparator 108 may compare the voltage V_C2 with the known reference voltage V_REP. If the voltage V_REF is less than V_C2, the signal COMP_OUT may be set to LOW (e.g., "0"). If the voltage V_REF is greater than V_C2, the signal COMP_OUT signal may be set to HIGH (e.g., "1"). The comparator 108 may initiate the comparison operation when the signal COMP_CLK is set to HIGH. When the signal COMP_CLK is set to LOW, the comparator 108 may retain the previous state.

In one example, the circuit 110 may be implemented as an N-bit counter. The counter 110 may count up by one every time the signal COUNTER_CLK is pulsed (or toggled). The signal COUNTER_CLK may be received from the digital state machine 106. The counter 110 may be preset to the minimum value before the calibration operation. The reset signal RST may be generated by the digital state machine 106.

The circuit 102 may comprise a bank of switchable current sources 150a-150n. In one example, the current sources 150a-150n may be binary weighted. For example, the circuit 102 may be implemented as an one or more N-bit binary weighted current sources 150a-150n. The switches SWa-SWn may be directly controlled by the signal N_BITS generated by the counter circuit 110. The current sources 150a-150n may be turned ON when the input to the switch goes HIGH. The circuit 102 may generate the signal I_INTEG. The signal I_INTEG may be a current presented to the circuit 104.

In one example, the circuit 106 may be implemented as digital circuitry implementing a state machine. The circuit 106 may initiate the calibration operation and/or control the timing of the calibration circuit 104. Calibration may be initiated by the signal CAL_START being set to HIGH. The state machine 106 generally uses a clock input (e.g., SYS_CLK) to generate the timing signals. The clock signal (e.g., COUNTER_CLK) may be used by the counter circuit 110. In one example, the signal SYS_CLK may be a system clock oscillating at a generally fixed frequency used to control the state machine 106 and/or other blocks in the system 100. The state machine 106 may generate the signal RST before calibration is initiated. The signal. RST may reset all the blocks in the system 100 to a known state and/or discharge all the capacitors in the system 100.

The end of a calibration operation may be signaled by the signal CAL_DONE being set to HIGH. The signal CAL_DONE may be generated when the signal COMP_OUT is set to HIGH. The state machine 106 may freeze the signal COUNTER_CLK presented to the counter block 110 to stop counting. The digital code output (e.g., N_BITS) of the counter circuit 110 may be preserved. The output of the circuit 102 may be directed to a diode connected to the NMOS device T1 to generate the voltage V_SLEW. The current through the diode connected to the NMOS device T1 may represent the calibrated current I_SLEW. The calibrated current I_SLEW may be copied over to the destination blocks (e.g., to an output driver). The closed loop digital calibration system will increment the up counter block (110) until V_C2>=V_REF—after which COMP_OUT goes high and initiates an end of the calibration sequence.

The signal C1_RST may reset the capacitor C1. The signal C1_RST may be pulsed before the signal C_INTEG is set to HIGH. The signal C_INTEG may be set to HIGH when the calibration current I_INTEG from the circuit 102 needs to be integrated onto the capacitor. The integration time (e.g., T_INTEG) may be controlled by the digital state machine 106. The integration time may be T_INTEG is the time for which the signal C_INTEG stays HIGH.

In one example, the voltage V_C1 may be scaled to a voltage V_C2 with the help of another capacitor C2. The scaling may be done to the voltage V_C2 in order to have a voltage at the input of the comparator 108 in a reasonable range (e.g., so that the signal V_REF may be chosen without much constraint). The signal C_TRANSFER may be set to HIGH to allow the voltage V_C1 to be scaled across to the voltage V_C2. The voltage V_C1=I_CAL*T_INTEG/C1 and the voltage V_C2=(C1/C2)*V_C1.

Figure 3:
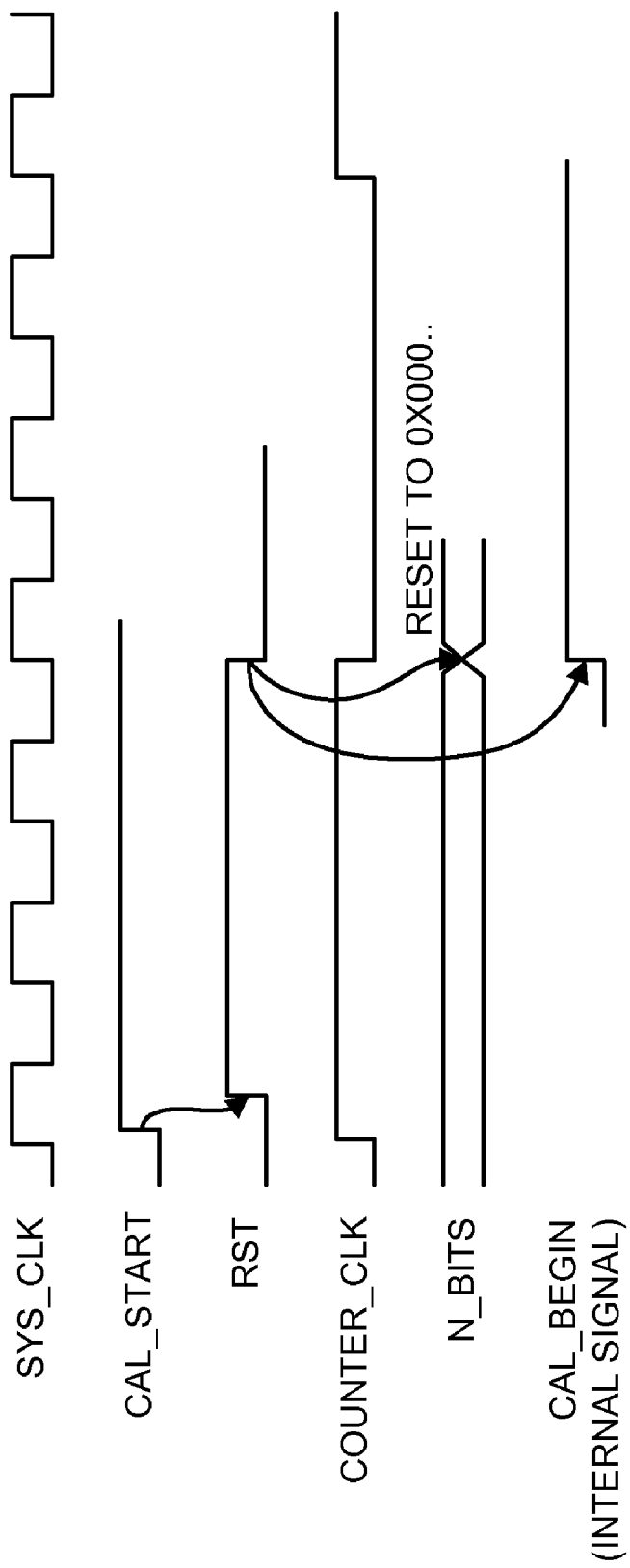
FIG. 3 is a clock diagram for initializing a calibration sequence.

Referring to FIG. 3, a diagram illustrating various waveforms of the initialization of the calibration sequence is shown. The clock signal SYS_CLK is shown in relation to the signals CAL_START, RST, COUNTER_CLK, N_BITS and/or CAL_BEGIN.

Figure 4:
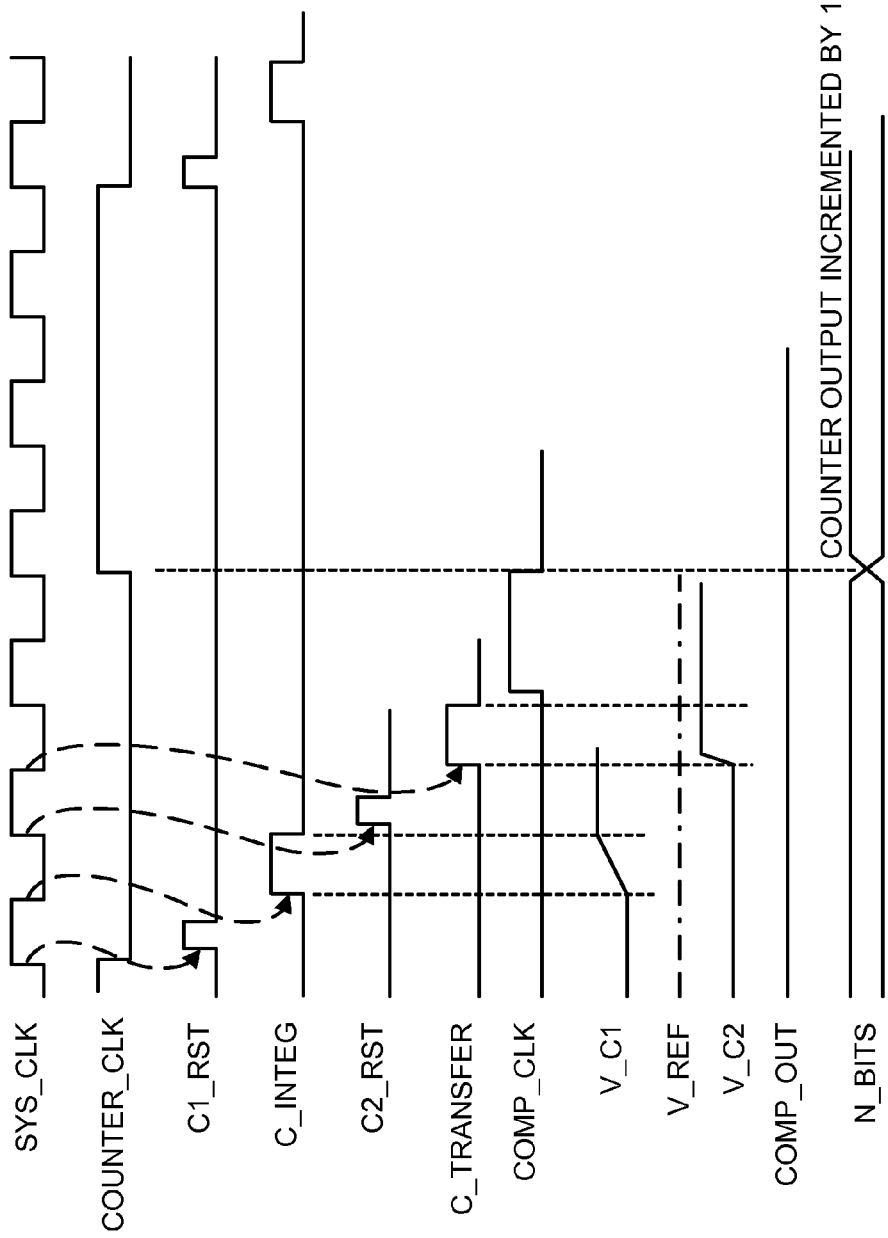
FIG. 4 is a clock diagram for operation of the calibration sequence.

Referring to FIG. 4, a diagram illustrating waveforms of the calibration operation is shown. Timing relationships between the signals SYS_CLK, COUNTER_CLK, C1_RST, C_INTEG, C2_RST, C_TRANSFER, COMP_CLK, V_C$_1$, V_REF, V_C2, COMP_OUT, and/or N_BITS are shown.

Figure 5:
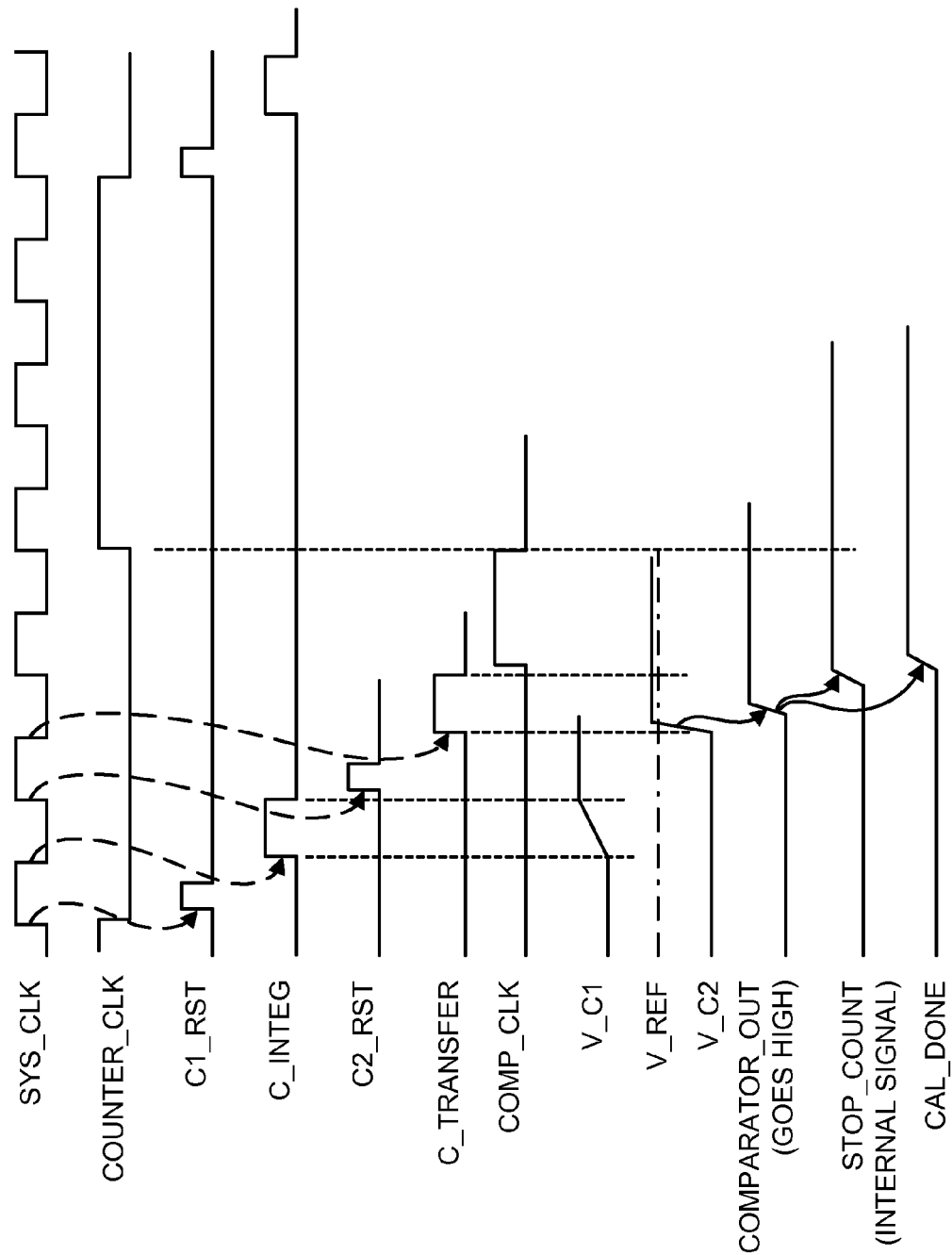
FIG. 5 is another clock diagram for operation of the calibration sequence.

Referring to FIG. 5, a timing diagram illustrating an overview how the timing signals and/or the calibration procedure is accomplished is shown. The voltage V_C1 may be charged up and transferred to the voltage V_C2. The voltage V_C2 may be compared with the voltage V_REF. The counter 110 may be incremented as COMP_OUT is set to LOW. A similar loop may continue until V_C2 is greater than or equal to V_REF. FIG. 5 illustrates an overview of one example of how the timing signals and/or the calibration procedure may be completed. When the voltage V_C2 is greater than V_REF, the signal COMPARATOR_OUT may be set to HIGH. The signal COMPARATOR_OUT may disable the counting operation while the signal CAL_DONE is initiated.

Figure 6:
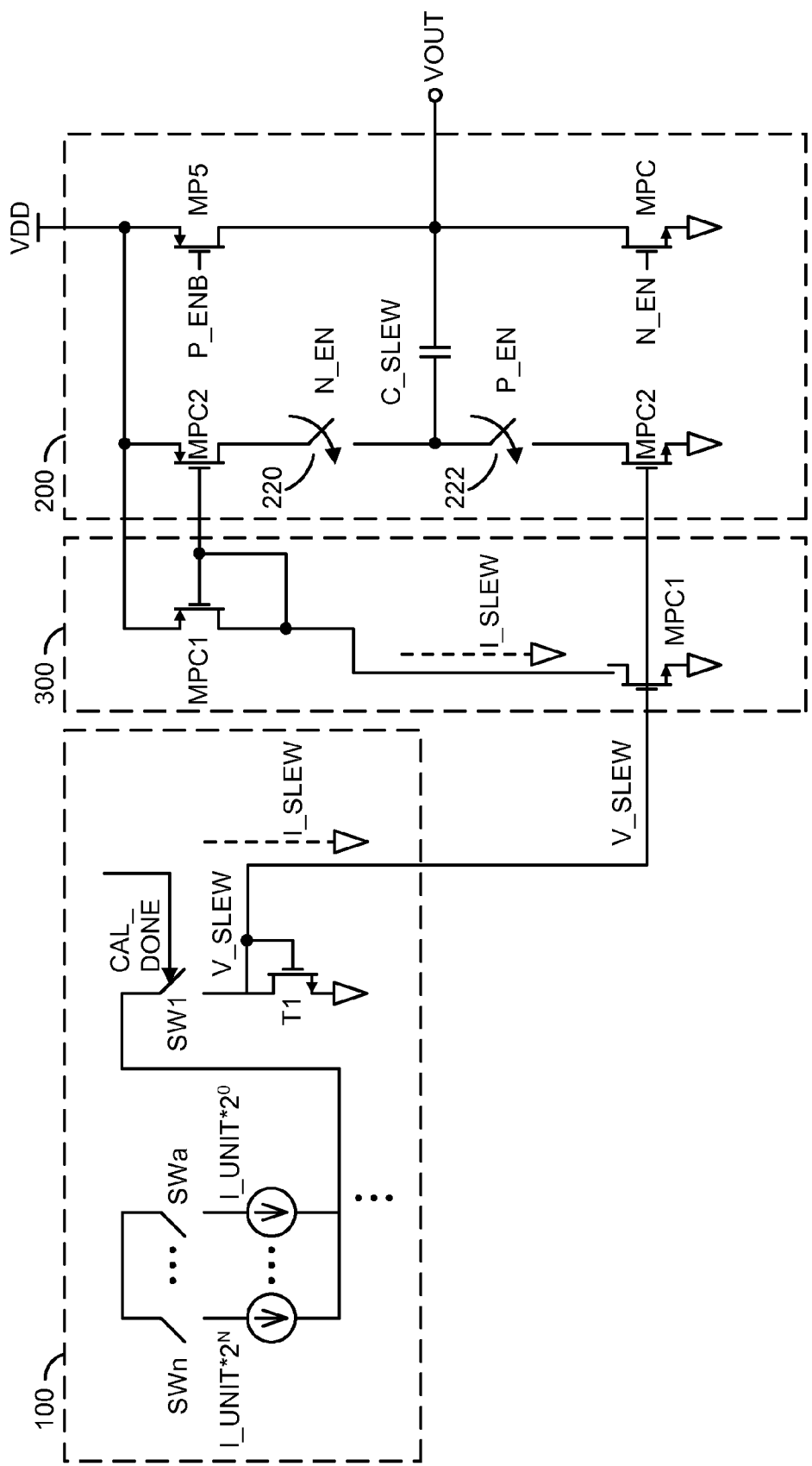
FIG. 6 is an example of an output buffer connected to calibration circuit.

Referring to FIG. 6, an example of an output buffer 200 is shown connected to the circuit 100. Only representative portions of the circuit 100 are shown for clarity. An interface circuit 300 is shown connected between the circuit 100 and the circuit 200. The output buffer 200 may have a device MPC2, a device MNC2, a device MP5 and a device MP6. The device MPC2 and the device MNC2 may mirror the current I_SLEW. A capacitance C_SLEW may connect the devices MPC2 and MNC2 with the devices MP5 and MP6. The output buffer 200 may drive the output VOUT to a HIGH state when the signal P_ENB transitions LOW. When the output VOUT transitions HIGH, the slew rate is controlled by the current I_SLEW (e.g., a switch 220 is normally closed by the signal P_EN transitioning HIGH). Similarly when the output VOUT is driven to a LOW state (e.g., by the N_EN transitioning HIGH), the slew rate is controlled by the current I_SLEW and the switch 222 being closed by the signal N_EN transitioning HIGH. The current I_SLEW may be derived from a bandgap reference with minimal variation over process, voltage and/or temperature variations. The slew rate of the output voltage VOUT may be defined by ISLEW/C_SLEW==> with ISLEW being constant and C_SLEW varying by >20% over process corners causes the slew rate of the output varying by >20%.

The circuit 300 generally comprises a device MPC1 and a device MPC2. The devices MPC1 and MPC2 may mirror the current I_SLEW that passes through the device T1. In one example, the system 100 may be implemented when the slew rate of the output buffer 200 needs to be kept within a certain range for (e.g., for a USB 2.0 full speed output driver the slew rate is generally within 4 ns-20 ns). The system 100 may be implemented in other applications where a current is integrated across a capacitor.

The slew rate of the output buffer 200 may be controlled by a constant current flowing into a capacitor. When the driver wants to pull up (e.g., VOUT is driven HIGH), the switch P_EN may be closed. The pullup current is generally constrained by I_SLEW and C_SLEW, where I_SLEW=C_SLEW*[dV/dt], [dV/dt]=rise/fall time and slew rate=I_SLEW/C_SLEW. Similarly, when the output driver 200 needs to pull down (e.g., VOUT is driven LOW), the switch N_EN may be closed and the pulldown current is constrained by I_SLEW and C_SLEW.

The slew rate is dependent on the signal I_SLEW and the signal C_SLEW. The signal I_SLEW may be derived from a bandgap reference. The signal I_SLEW may be kept constant over process and/or temperature. The signal C_SLEW may be a capacitor. In one example, the signal C_SLEW may be implemented with metal layers (e.g., a comb structure). The capacitor value may vary over process since the dielectric constant and/or metal thickness may vary from die-to-die and wafer-to-wafer. The variation may be up to +/−20%, causing the slew rate to vary.

The slew rate may be kept approximately constant if the capacitor is made tunable. The current I_SLEW may be tuned to mimic the capacitor variation. The system 100 may implement the calibration circuit 104 and/or the digital state machine 106 to control the calibration operation.

The various signals of the present invention are generally "on" (e.g., a digital HIGH, or 1) or "off" (e.g., a digital LOW, or 0). However, the particular polarities of the on (e.g., asserted) and off (e.g., de-asserted) states of the signals may be adjusted (e.g., reversed) to meet the design criteria of a particular implementation. Additionally, inverters may be added to change a particular polarity of the signals.

While the invention has been particularly shown and described with reference to the preferred embodiments thereof, it will be understood by those skilled in the art that various changes in form and details may be made without departing from the scope of the invention.

The invention claimed is:

1. An apparatus comprising:
a first circuit configured to generate a slew rate control signal and a calibration signal in response to (i) a plurality of control bits and (ii) an operation signal;
a state machine configured to generate said operation signal and a plurality of intermediate control signals in response to (i) a compare signal and (ii) a clock signal;
a compare circuit configured to generate said compare signal in response to (i) a reference voltage and (ii) a capacitance signal; and
a calibration circuit configured to generate said capacitance signal in response to (i) said calibration signal and (ii) said plurality of intermediate control signals.

2. The apparatus according to claim 1, wherein a counter circuit generates said plurality of control bits.

3. The apparatus according to claim 1, wherein said first circuit comprises a plurality of current sources.

4. The apparatus according to claim 1, wherein said first circuit comprises a plurality of binary weighted current sources.

5. The apparatus according to claim 1, wherein said compare circuit comprises a capacitor calibration loop.

6. The apparatus according to claim 1, wherein said slew rate control signal is generated by a diode connected to a transistor device.

7. The apparatus according to claim 1, wherein said calibration signal charges a plurality of capacitors in said compare circuit.

8. The apparatus according to claim 1, wherein said state machine comprises digital circuitry.

9. The apparatus according to claim 1, wherein said apparatus provides tuning to compensate for process corner variations.

10. The apparatus according to claim 9, wherein said tuning is implemented without the need for post-production tuning capacitors.

11. The apparatus according to claim 1, wherein said slew signal is configured to provide a constant slew rate in an output buffer.

12. The apparatus according to claim 1, wherein said apparatus is configured to initialize in response to a reset signal.

13. An apparatus comprising:
means for generating a slew rate control signal and a calibration signal in response to (i) a plurality of control bits and (ii) an operation signal;
means for generating generate said operation signal and a plurality of intermediate control signals in response to (i) a compare signal and (ii) a clock signal;
means for generating said compare signal in response to (i) a reference voltage and (ii) a capacitance signal; and
means for generating said capacitance signal in response to (i) said calibration signal and (ii) said plurality of intermediate control signals.

14. An method for implementing a consistent slew rate over process corners in an output buffer, comprising the steps of:
generating a slew rate control signal and a calibration signal in response to (i) a plurality of control bits and (ii) an operation signal;
generating generate said operation signal and a plurality of intermediate control signals in response to (i) a compare signal and (ii) a clock signal;
generating said compare signal in response to (i) a reference voltage and (ii) a capacitance signal; and
generating said capacitance signal in response to (i) said calibration signal and (ii) said plurality of intermediate control signals.

* * * * *